US007132846B2

(12) United States Patent
Kim et al.

(10) Patent No.: US 7,132,846 B2
(45) Date of Patent: Nov. 7, 2006

(54) METHOD AND APPARATUS FOR TESTING LIQUID CRYSTAL DISPLAY

(75) Inventors: Jong Dam Kim, Kyounggi-do (KR); Hyun Kyu Lee, Seoul (KR); Yong Jin Cho, Seoul (KR); See Hwa Jeong, Kyounggi-do (KR)

(73) Assignee: LG.Phillips LCD Co., Ltd., Seoul (KR)

( * ) Notice: Subject to any disclaimer, the term of this patent is extended or adjusted under 35 U.S.C. 154(b) by 0 days.

(21) Appl. No.: 10/665,576

(22) Filed: Sep. 22, 2003

(65) Prior Publication Data

US 2004/0222813 A1 Nov. 11, 2004

(30) Foreign Application Priority Data

May 6, 2003 (KR) ..................... 10-2003-0028646

(51) Int. Cl.
*G01R 31/00* (2006.01)

(52) U.S. Cl. ..................................................... 324/770

(58) Field of Classification Search ................ 324/770, 324/158.1; 257/48; 438/17–18
See application file for complete search history.

(56) References Cited

U.S. PATENT DOCUMENTS

| | | | | |
|---|---|---|---|---|
| 5,233,448 | A * | 8/1993 | Wu | 349/40 |
| 5,537,054 | A * | 7/1996 | Suzuki et al. | 324/770 |
| 6,327,071 | B1 * | 12/2001 | Kimura | 359/291 |
| 6,545,500 | B1 * | 4/2003 | Field | 324/770 |
| 6,720,791 | B1 * | 4/2004 | Cheng et al. | 324/770 |
| 6,791,632 | B1 * | 9/2004 | Lee et al. | 349/40 |

* cited by examiner

*Primary Examiner*—Paresh Patel
(74) *Attorney, Agent, or Firm*—Birch, Stewart, Kolasch & Birch, LLP

(57) ABSTRACT

A method and apparatus are provided for inspecting an electrical defectiveness of a liquid crystal display substrate. The method includes shorting ESD protection devices with a conductive shorting bar to form a current path on each of signal wirings of the substrate, supplying a current to the signal wirings, and determining a defectiveness of the signal wirings depending on the current flowing on the signal wirings.

9 Claims, 8 Drawing Sheets

METHOD AND APPARATUS FOR TESTING LIQUID CRYSTAL DISPLAY

The present application claims, under 35 U.S.C. § 119, the priority benefit of Korean Patent Application No. P2003-28646 filed May 6, 2003, the entire contents of which are herein fully incorporated by reference.

BACKGROUND OF THE INVENTION

1. Field of the Invention

The present invention relates to a liquid crystal display (LCD), and more particularly, to a method and apparatus for inspecting an electrical defectiveness of an LCD by using an electrostatic discharge damage (ESD) protection device.

2. Description of the Related Art

Display apparatuses have become important as visual information transferring media. Among the display apparatuses, a cathode ray tube is widely used at present, but is disadvantageous in that its weight and volume are large. Therefore, various types of flat display apparatuses have been developed that are capable of overcoming the defects of the cathode ray tube. An LCD, a field emission display (FED), a plasma display panel (PDP), and an electroluminescence (EL) display are different examples of flat display apparatus. Most of these apparatuses are available in the market.

The LCD device is easily adaptive due its smallness which improves productivity. Thus, it is quickly replacing the cathode ray tubes in many applications. In particular, the LCD device of an active matrix type for driving a liquid crystal cell by using a thin film transistor (hereinafter referred to as "TFT") has an advantage in that the picture quality it provides is excellent, and its power consumption is low. Such LCDs have been rapidly developed into a large size and high definition due to the recent productivity technology and research.

A process for fabricating the LCD device of the active matrix type is divided into a substrate cleaning, a substrate patterning, an alignment forming/rubbing, a substrate assembling/a liquid crystal material injecting, a mounting, an inspecting and a repairing, etc.

Generally, impurities on the substrate surface of the LCD device are removed by a detergent in the substrate cleaning process.

The substrate patterning process is divided into a patterning of an upper substrate (color filter substrate) of an LCD and a patterning of a lower substrate (TFT array substrate) of the LCD. There are formed a color filter, a common electrode, a black matrix, etc. on the upper substrate. There are formed signal wirings such as data lines and gate lines on the lower substrate, TFTs (thin film transistors) each at an intersection of the corresponding data line and the corresponding gate line, and pixel electrodes each in a pixel region between the corresponding gate line and the corresponding data line connected to a source electrode of the TFT.

An alignment film is applied to each of the upper substrate and the lower substrate in the alignment film forming/rubbing process and the alignment film is rubbed by a rubbing material.

In the substrate assembling/the liquid crystal injection process, the upper substrate and the lower substrate are bonded together by using a sealant, and the liquid crystal material and spacers are injected through a liquid crystal injection hole. Then the liquid crystal injection hole is sealed.

In the mounting process of the liquid crystal panel, a tape carrier package (TCP) mounted with integrated circuits such as a gate drive integrated circuit and a data drive integrated circuit, is connected to a pad part on the substrate. Such drive integrated circuits may be directly mounted on the substrate by using a chip on glass (COG) method other than a tape automated bonding (TCB) using the TCP described above.

The inspecting process includes a first electrical inspection performed after a variety of signal wirings and the pixel electrodes are formed and a second electrical inspection and a visual inspection performed after the substrate assembly/liquid crystal injection process. Specifically, the electrical inspection of the signal wirings and the pixel electrodes of the lower substrate followed by the substrate assembling may reduce an undesirable ratio and a waste matter and may find a defective substrate capable of repairing at an early stage.

The repairing process performs a restoration for a repairable substrate determined by the inspecting process. However, in the inspecting process, defective substrates beyond repair are discarded.

The electrical inspection of the lower substrate (TFT array substrate) of a general LCD, which is performed before the substrate assembling, frequently employs a method using an apparatus shown in FIG. 1. Referring to FIG. 1, this electrical inspection process includes: placing a modulator 10 over a TFT array substrate 11 of an LCD to be tested with a designated gap, applying a test voltage (Vtest) to the modulator 10 while maintaining the gap, detecting a light reflected from the modulator 10 in response to the test voltage, and determining an electrical defectiveness of signal wirings 17 and 18 (data and gate lines) of the LCD substrate.

In the modulator 10, a polymer-dispersed liquid crystal (hereinafter referred to as "PDLC") 14 is put between an upper transparent substrate 12 having a common electrode 13 formed thereon and a lower transparent substrate 15. In the modulator 10, a reflection sheet 16 is mounted on a rear surface of the lower transparent substrate 15. The modulator 10 has an air nozzle and a vacuum nozzle for auto-gapping that is used to maintain a designated gap between the modular 10 and the TFT array substrate 11 being inspected.

Above the modulator 10, a lens 21 is provided for focusing a light 22 from a light source (not shown) onto the modulator 10 and for transmitting any light 22 reflected from the modulator 10 during the inspection.

The TFT array substrate 11 being tested includes thereon TFTs 19, the signal wirings 17 and 18 (data and gate lines crossing each other in a matrix format) and pixel electrodes 20. The TFT array substrate 11 is formed in a liquid crystal display apparatus of the active matrix type.

The electrical inspection of the TFT array substrate 11 begins by loading the substrate 11 to be tested below the modulator 10 and lowering the modulator 10 with a certain gap maintained between the modulator 10 and the substrate by auto-gapping. While the gap between the modulator 10 and the substrate 11 is maintained at a predetermined effective gap, the light 22 from the light source is radiated towards the modulator 10 and focused onto the modulator 10 via the focusing lens 21, and simultaneously a test voltage (Vtest) is applied to the common electrode 13. And a test data applied from a driving circuit in a jig (not shown) is applied to the data lines 17 and a test scan signal is applied to the gate lines 18. Then, an effective electric field is applied to the PDLC 14 between the common electrode 13 of the modulator 10 and the pixel electrode 20 to be tested.

If the electric field is not applied, the PDLC 14 causes the light 22 from the light source above the modulator 10 to be scattered. However, if the effective electric field (E) is applied, the liquid crystal molecules in the PDLC 14 become aligned to the direction of the effective electric field (E) and cause the light from the light source to be transmitted through the PDLC 14. That is, if the wirings 17 and 18 properly work, then the PDLC 14 will cause the light from the light source to be transmitted through the PDLC 14. Accordingly, during this electrical inspection process, the liquid crystal layer of the PDLC 14 corresponding to the pixel electrode 20 to which the voltage is properly applied and transmitted, causes the light 22 to be transmitted through the PDLC 14. However, if the voltage is not properly transmitted to the pixel electrode 20, e.g., due to a defect in the wiring(s) associated with the pixel electrode 20, then the liquid crystal layer of the PDLC 14 causes the light 20 to be scattered in that part.

The light 22 transmitted through the liquid crystal layer of the PDLC 14 is reflected on the reflection sheet 16 of the modulator 10 and is reversely directed back to the lens 21, while the light 22 scattered in the liquid crystal layer of the PDLC 14 is vanished and is not incident to the reflection sheet 16. The light reflected by the reflection sheet 16 of the modulator 10 and transmitted out from the modulator 10 is then received by a charge-coupled device (CCD) (not shown) via the focusing lens 21. The reflected light is then converted into an electrical signal and transferred to a display apparatus via a signal processing circuit. A testing inspector monitors an image or data displayed on the display apparatus to determine whether or not there is a defect in the wirings 17 and 18 of the substrate 11 and performs a second, closer inspection about the signal wirings 17 and 18 of doubtable point if a defect is initially detected.

The modulator 10 can provide reliability, but has a defect of high price. Further, since the inspection region is narrow as compared with the full area of the substrate 11, the modulator 10 must repeat the process of inspection for each of different wirings sequentially by moving a designated distance in the vertical or horizontal direction and then stopping temporarily for auto-gapping. This requires a significant amount of inspection time.

SUMMARY OF THE INVENTION

Accordingly, it is an object of the present invention to provide a method and apparatus for inspecting a liquid crystal display in order to inspect an electrical defectiveness by using an ESD protection device.

It is another object of the present invention to provide a method and apparatus for inspecting a liquid crystal display, which overcome the limitations and disadvantages of the related art.

In order to achieve these and other objects of the invention, a method for inspecting a display device substrate having a plurality of signal wirings and a plurality of electrostatic discharge damage (ESD) protection devices, includes shorting the ESD protection devices to form a current path on each of the signal wirings, supplying a current to the signal wirings, and determining a defectiveness of at least one of the signal wirings depending on the current flowing on the signal wirings.

In accordance with an aspect of the invention, a method for inspecting a display device substrate having a plurality of signal wirings and a plurality of electrostatic discharge damage (ESD) protection devices, includes supplying a voltage to a control terminal of each of the ESD protection devices to turn on the ESD protection devices and thereby form a current path on each of the signal wirings, supplying a current to the signal wirings, and determining a defectiveness of at least one of the signal wirings depending on the current flowing on the signal wirings.

In accordance with an aspect of the invention, an apparatus for inspecting a display device substrate having a plurality of signal wirings and a plurality of electrostatic discharge damage (ESD) protection devices, includes a conductive shorting bar to short the ESD protection devices, a power supply to supply a current to the signal wirings, and a detection circuit to determine a defectiveness of the signal wirings depending on a current flowing on the signal wirings.

In accordance with an aspect of the invention, an apparatus for inspecting a display device substrate having a plurality of signal wirings and a plurality of electrostatic discharge damage (ESD) protection devices, includes a control circuit to supply a voltage to a control terminal of the ESD protection devices to turn on the ESD protection devices, so as to form a current path on the signal wirings, a power supply to supply a current to the signal wirings, and a detection circuit to determine a defectiveness of the signal wirings depending on a current flowing on the signal wirings.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Reference will now be made in detail to the preferred embodiments of the present invention, examples of which are illustrated in the accompanying drawings. Hereinafter referring to FIGS. 2 to 9, the preferred embodiments of the present invention will be explained.

The present invention utilizes ESD protection devices present in a liquid crystal display to inspect the signal wirings of the TFT array substrate of the liquid crystal display. According to the present invention, the method and apparatus for inspecting the liquid crystal display inspects an electrical characteristic of the signal wirings formed within the TFT array of an effective display of the liquid crystal display in a state where ESD protection devices 1*a* to 1*c* and 2*a* to 2*c* are shorted as shown in FIG. 2.

Figure 1:
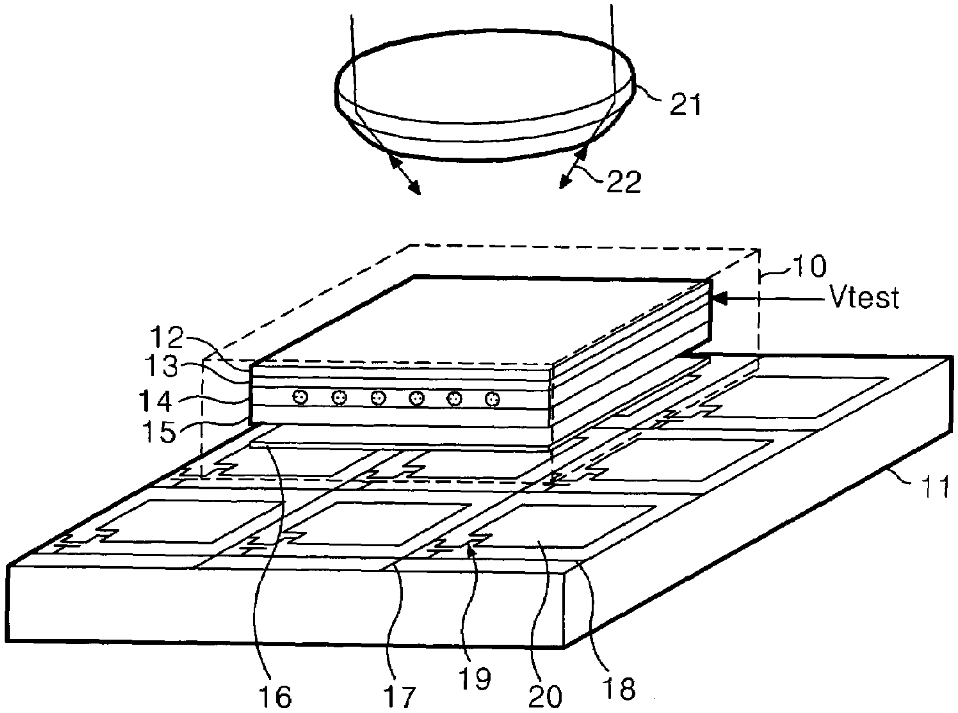
FIG.1 RELATED ART
FIG. 1 is a perspective view illustrating an apparatus for electrically inspecting a liquid crystal display in general.
Figure 2:
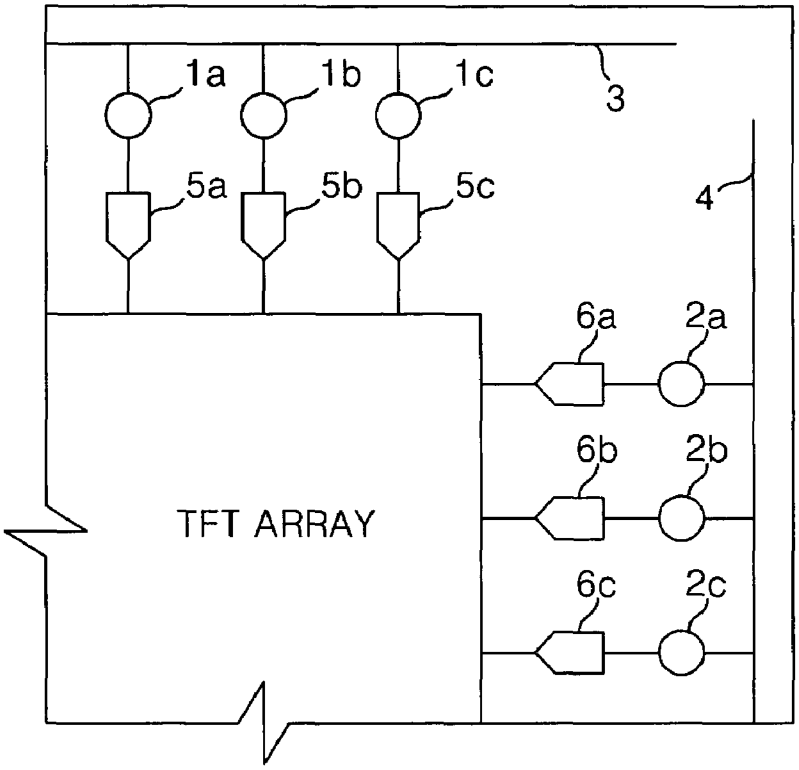
FIG. 2 is a plan view illustrating an ESD protection device formed on a substrate of a liquid crystal panel according to an embodiment of the present invention.

Referring to FIG. 2, in a liquid crystal display having the TFT array on a TFT array substrate, a plurality of ESD protection devices 1*a* to 1*c* and 2*a* to 2*c* are provided at an exterior of the TFT array to provide ESD protection. As known, the TFT array includes the signal wirings such as data and gate lines, TFTs, pixel electrodes, etc. The ESD protection devices include a first group of ESD protection devices 1*a* to 1*c* connected between data pads 5*a* to 5*c* and a data shorting wiring 3 of the TFT array substrate, and a second group of ESD protection devices 2*a* to 2*c* connected between gate pads 6*a* to 6*c* and a gate shorting wiring 4. Generally a common voltage (Vcom) or a ground voltage (GND) is supplied to the data shorting wiring 3 and the gate shorting wiring 4.

A static electricity may be in flow in the TFT array during a fabricating process of the liquid crystal display such as during a depositing process or an alignment film rubbing process. The static electricity induces an insulating destruction of an insulating layer stacked on the TFT array substrate or destroys the TFTs. Further, if the static electricity is in flow in the TFT array, an electrostatic force arises in the TFT array to cause impurities such as dust particles to attach on the TFT array substrate. At the generation of the static electricity which gives a fatal adverse effect to the TFT array substrate, the ESD protection devices 1*a* to 1*c* and 2*a* to 2*c* begin to operate to connect the signal wirings (data and gate wirings) of the TFT array to the data shorting wiring 3 and the gate shorting wiring 4, respectively. Accordingly, the static electricity is bypassed or discharged to the data shorting wiring 3 and the gate shorting wiring 4 via the ESD protection devices 1*a* to 1*c* and 2*a* to 2*c*. This causes the signal wirings of the TFT array and the shorting wirings 3 and 4 to become equipotential.

According to an embodiment of the present invention, the ESD protection devices 1*a* to 1*c* and 2*a* to 2*c* formed in the liquid crystal display are served to cut off the static electricity flowing in the TFT array and to short the adjacent signal wirings (e.g., data and gate lines) during an electrical inspection process to form a current path. One example of each of the ESD protection devices 1*a* to 1*c* and 2*a* to 2*c* at this stage according to the embodiment of the present invention is depicted in FIG. 3.

Figure 3:
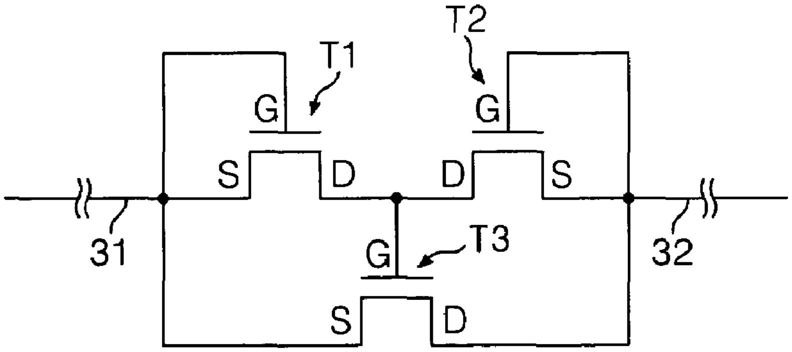
FIG. 3 is a circuit diagram illustrating one example of a ESD protection device according to an embodiment of the present invention.

FIG. 3 shows a circuit diagram of an ESD protection device connected between a corresponding signal wiring (e.g., a data or gate line) and a corresponding data/gate shorting wiring of an LCD according to an embodiment of the present invention. Referring to FIG. 3, the ESD protection device (1*a*, 1*b*, 1*c*, 2*a*, 2*b* or 2*c*) includes first and second TFTs T1 and T2 whose source terminals S and gate terminals G are shorted respectively, and a third TFT T3 whose gate terminal G is connected to the drain terminals D of the first and the second TFTs T1 and T2.

Particularly, the drain terminal D of the first TFT T1 is connected to the drain terminal D of the second TFT T2. The source terminal S of the third TFT T3 is connected in common to the source and gate terminals G and S of the first TFT T1 and a first wiring 31. The drain terminal D of the third TFT T3 is connected in common to the source and gate terminals G and S of the second TFT T2 and a second wiring 32.

Here it is assumed that the first wiring 31 is connected to a signal wiring (e.g., data or gate line) of the TFT array and that the second wiring 32 is connected to a shorting wiring (gate or data shorting wiring such as 3 or 4 in FIG. 2) to which the common voltage Vcom or the ground voltage GND is supplied.

Generally the operation of the ESD protection devices is as follows. When the static electricity flows from the first wiring 31, the first TFT T1 is turned on and at the same time the second and third TFTs T2 and T3 are turned on while increasing the gate voltages of the second and third TFTs T2 and T3. Then, the current path is formed between the first wiring 31 and the second wiring 32 and the static electricity on the first wiring 31 is bypassed to a shorting bar via the second wiring 32.

On the other hand, if the static electricity does not flow from the first wiring 31, the first and third TFTs T1 and T3 are maintained at an off state and the gate terminal G of the second TFT T2 is maintained at a floating state since a voltage below a threshold voltage is applied to the gate terminals G. At this state, the ESD protection device blocks the current path between the first wiring 31 and the second wiring 32 to insulate the first wiring 31 and the second wiring 32 from each other.

The inspection method and apparatus of the liquid crystal display according to the different embodiments of the present invention discussed herein employ ESD protection devices such as ones shown in FIGS. 2 and 3. However, the inspecting method and apparatus according to the present invention are not restricted to the use of the ESD protection devices shown in FIGS. 2 and 3, but are equally applicable to the use of any other type of ESD protection devices and to the inspection of any other types of displays.

Figure 4:
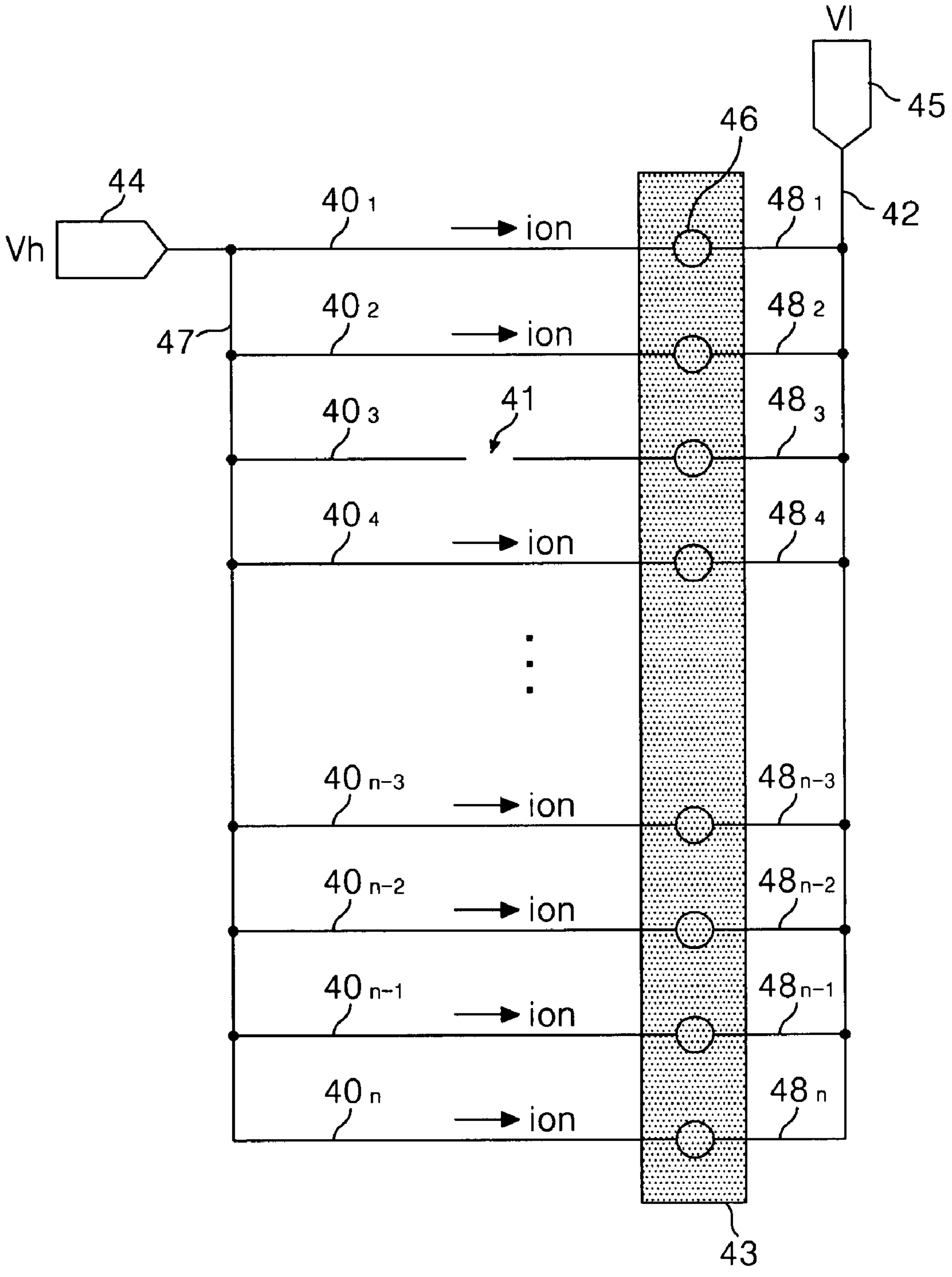
FIG. 4 illustrates an inspecting method of a liquid crystal display according to a first embodiment of the present invention.
Figure 5:
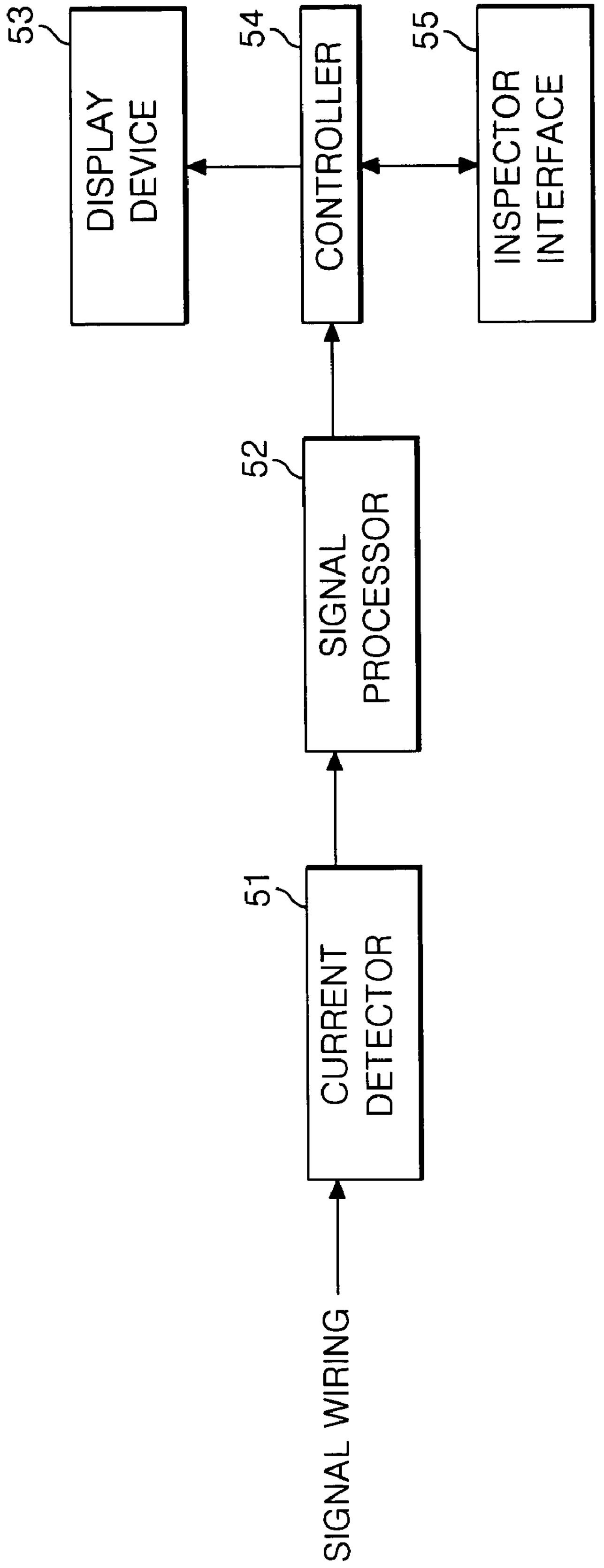
FIG. 5 is a block diagram schematically illustrating an inspecting apparatus of a liquid crystal display according to an embodiment of the present invention.

FIGS. 4 and 5 illustrate the inspection method and apparatus of a liquid crystal display according to a first embodiment of the present invention.

Referring to FIGS. 4 and 5, the inspecting apparatus for a liquid crystal display according to the first embodiment of the present invention includes a conducting shorting bar 43 for shorting a plurality of ESD protection devices 46 of a liquid crystal display. The conducting shorting bar 43 is installed in a jig or housing and is movable (e.g., vertically) with respect to the ESD protection devices 46. Besides the conducting shorting bar 43, the inspection apparatus further includes a power supply for supplying a voltage to a substrate to be inspected, where the power supply may also be installed in the jig or housing.

The substrate to be inspected in this example is a lower substrate (TFT array substrate) of a liquid crystal panel. This substrate, as discussed in reference to FIG. 2, includes a TFT array having TFTs, pixel electrodes, and signal wirings $\mathbf{40}_1$ to $\mathbf{40}_n$ such as gate wirings and/or data wirings (e.g., gate lines and/or data lines), etc., and the ESD protection devices and shorting wirings formed outside and around the TFT array.

Particularly, in the substrate shown in FIG. 4, a first shorting wiring 47 for shorting the signal wirings $\mathbf{40}_1$ to $\mathbf{40}_n$, a first pad 44 connected to the first shorting wiring 47, a second shorting wiring 42 connected commonly to side wirings $48_1$ to $48_n$ connected to one side of the ESD protection devices 46, and a second pad 45 connected to the second shorting wiring 42.

In one embodiment, after forming the gate wirings, the gate electrodes of the TFTs and the gate pads on the lower substrate but prior to forming data wirings, data electrodes and data pads, the electrical inspection on the gate wirings and the gate electrodes can be performed.

Further, the inspection apparatus of the liquid crystal display according to the present invention includes, as shown in FIG. 5, a current detector 51 for detecting the current from the signal wirings $40_1$ to $40_n$, a signal processor 52 for signal processing the current from the current detector 51, a controller 54 for displaying the current data from the signal processor 52 on a display device 53 or other indication device, and an inspector interface 55 for supplying user data (e.g., user commands, instructions, etc.) to the controller 54. These components are all operatively coupled.

The current detector 51 is connected to each of the signal wirings $40_1$ to $40_n$ of the substrate to detect the current flowing in each of the signal wirings $40_1$ to $40_n$ while the electrical characteristic inspection on the substrate is carried out. The signal processor 52 removes any noise of an analog current signal detected and provided from the current detector 51, amplifies the processed signal, converts it into a digital signal, and then supplies it to the controller 54.

The controller 54 displays the current data (i.e., data pertaining to the detected current) provided form the signal processor 52 with a designated display format such as a numerical data and/or a graph on the display device 53, and can control the display format in accordance with the data provided from the inspector interface 55. Further, the inspection apparatus according to the embodiment of the present invention may further include a light source (not shown) for representing a real image of the substrate, a CCD (charge coupled device), a magnification adjusting circuit of the CCD, and so on.

In order to carry out the electrical inspection of the substrate (e.g., TFT array substrate of an LCD) according to the first embodiment of the present invention, the substrate is loaded in the jig (or some other housing) and the ESD devices 46 of the substrate are electrically connected to the conductive shorting bar 43 as the conductive shorting bar 43 descends thereon. The power supply of the jig supplies a high voltage Vh to the first pad 44 and simultaneously supplies a low voltage Vl to the second pad 45. The high voltage Vh can be about several tens of volts (e.g., 10~99 volts) and the low voltage can be about several volts or a voltage between the common voltage Vcom and the ground voltage GND. Then the ESD protection devices 46 are mutually shorted by the conductive shorting bar 43 of the jig and as a result, the current paths are established between the signal wirings $40_1$ to $40_n$ and the side wirings $48_1$ to $48_n$, respectively, through the ESD protection devices 46.

In another embodiment, the signal wirings $40_1$ to $40_n$ can be selectively shorted, so that any desired signal wiring(s) can be individually shorted for electrical inspection. This can be accomplished by providing portions of the conductive shorting bar 43 that are selectively movable and corresponding to the signal wirings. In another embodiment, in the conductive shorting bar 43, a separate additional voltage may be supplied to the gate terminal of the third TFT T3 of one or more ESD protection devices 46 to turn on the third TFT T3 and thus form a current path between the source terminal S and the drain terminal D of the corresponding third TFT T3. In this way, the signal wirings $40_1$ to $40_n$ can be simultaneously or selectively inspected. Other schemes can be used to perform electrical inspection of the signal wirings as long as the electrical connection is provided between each of the signal wirings $40_1$~$40_n$ and a corresponding one of the side wirings $48_1$ to $48_n$.

If the current path is formed between the signal wirings $40_1$ to $40_n$ and the side wirings $48_1$ to $48_n$, the high voltage Vh is applied to each of the signal wirings $40_1$ to $40_n$ via the first pad 44 and the first shorting bar 47, and the low voltage V1 is applied to each of the side wirings $48_1$ to $48_n$ via the second pad 45 and the second shorting wiring 42, whereby the current (ion) flows from each of the signal wirings $40_1$ to $40_n$ to a corresponding one of the side wirings $48_1$ to $48_n$. At this time, if one of the signal wirings $40_1$ to $4_{0n}$ is opened due to, e.g., a pattern defect or pattern loss, the current will not flow therethrough. For example, if a portion of the third signal wiring $40_3$ is opened (41) as shown in FIG. 4, then the current does not flow on the third signal wiring $40_3$. This non-flow of current will be detected by the current detector 51 so that a defect in the third signal wiring $40_3$ can be detected according to the present invention. For instance, an inspector can monitor the image or the current data displayed on the display device 53 to recognize that the third signal wiring $40_3$ is opened in the substrate being inspected. Then the substrate having the open signal wiring can be moved to the repair process as needed.

Figure 6:
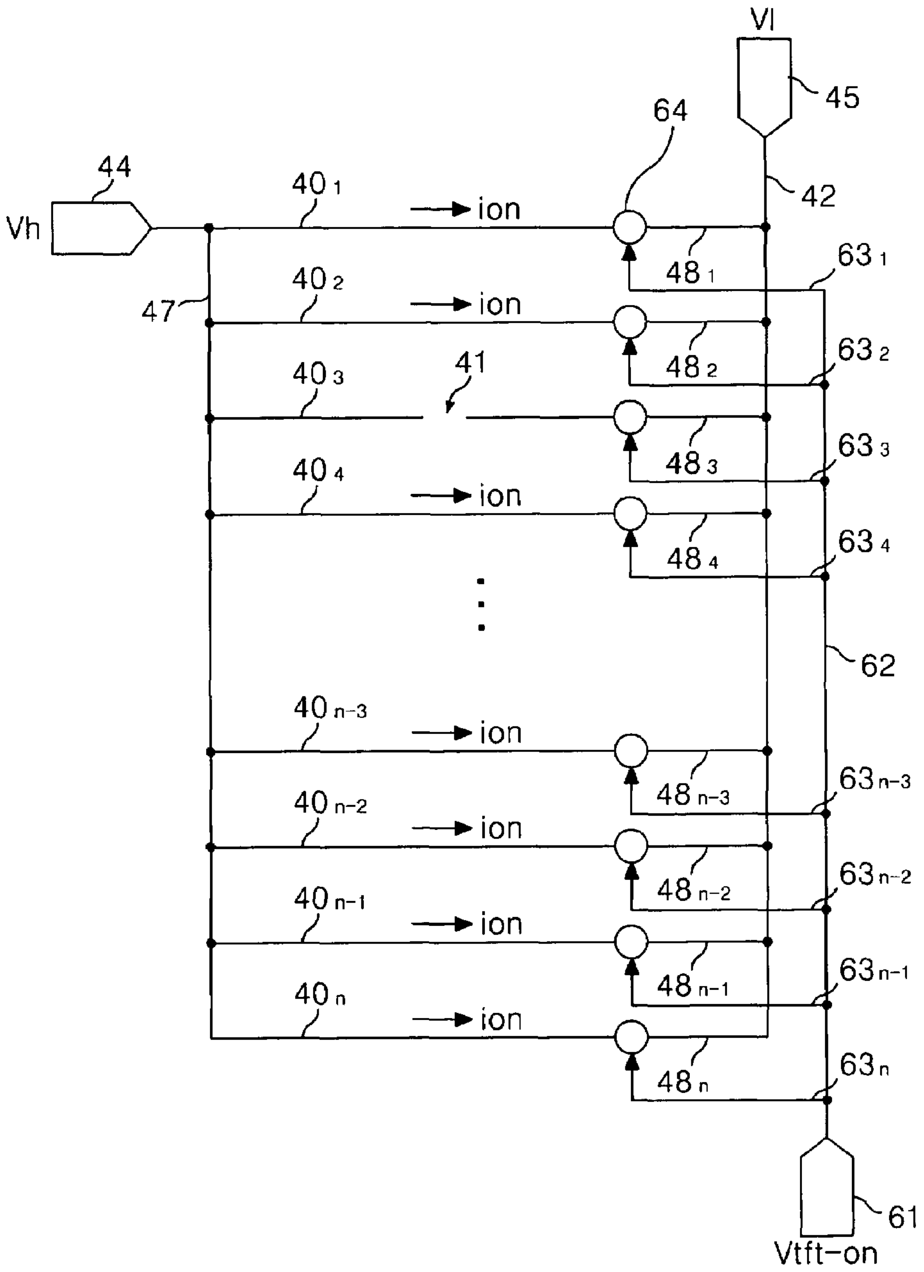
FIG. 6 illustrates an inspecting method of a liquid crystal display according to a second embodiment of the present invention.
Figure 7:
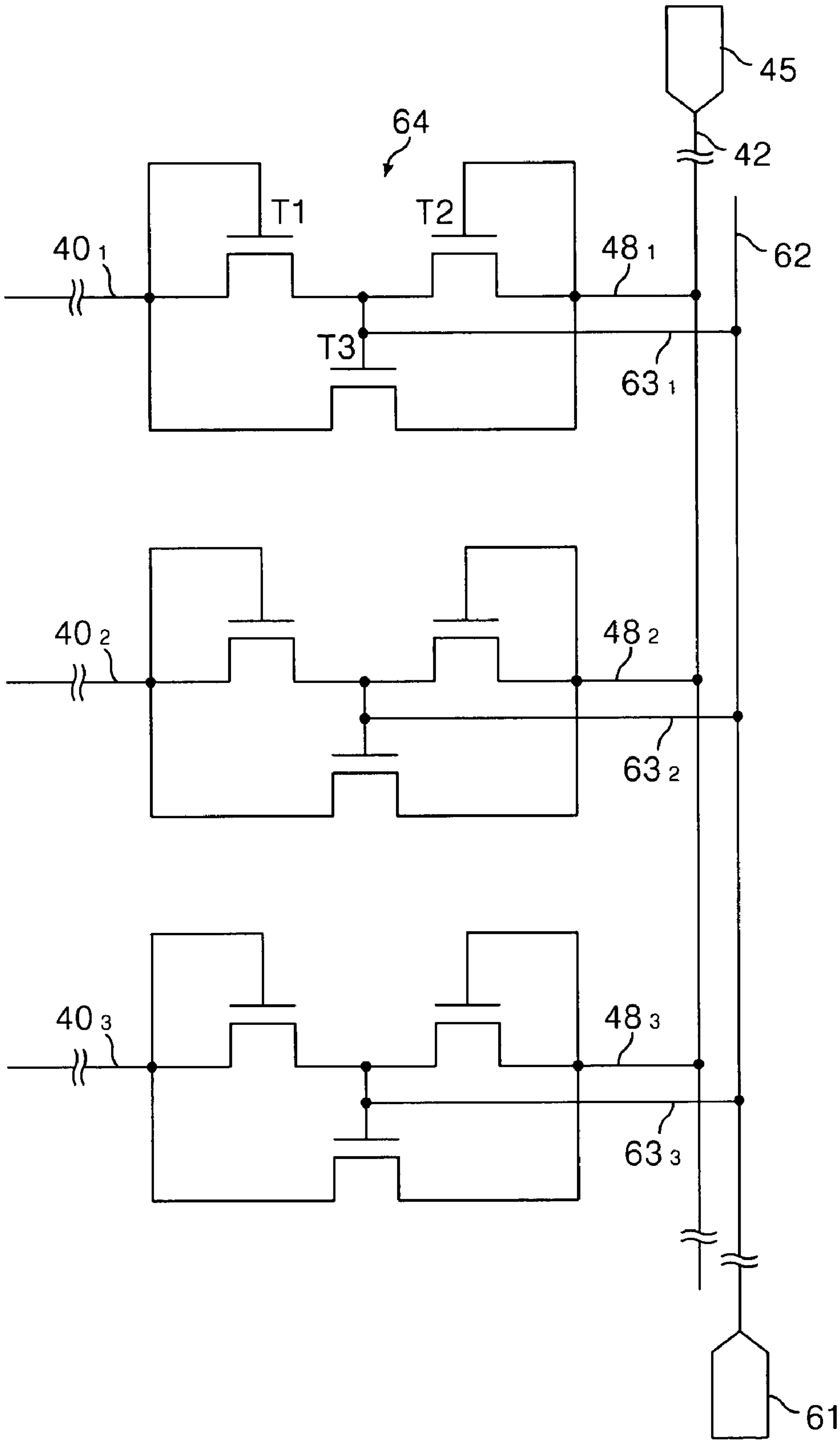
FIG. 7 is a circuit diagram in detail illustrating a connection of an ESD protection device shown in FIG. 6.

FIGS. 6 and 7 illustrates the inspection method for the liquid crystal display according to a second embodiment of the present invention. This method is implementable using the inspection apparatus shown in FIG. 5 or other suitable apparatus. In FIGS. 6 and 7, the same reference numerals are used on the same components as the substrate and the device of FIG. 4 to indicate same components, and thus the explanation therefore will be brief or omitted.

Referring to FIG. 6, the lower substrate of the liquid crystal panel includes the TFT array including the signal wirings $40_1$ to $40_n$, and pixel electrodes formed thereon, and ESD protection devices 64, the first shorting wiring 47, the first pad 44, the first side wirings $48_1$ to $48_n$, the second shorting wiring 42, the second pad 45, a third shorting wiring 63, a third pad 61 and second side wirings $63_1$ to $63_n$ formed at an exterior side of the TFT array or substrate.

When the electrical inspection on the substrate is carried out according to the second embodiment of the present invention, a voltage Vtft-on greater than the threshold voltage of the TFTs (of the ESD protection devices 46) for turning on forcedly the TFTs of the ESD protection device 64 is applied to the third pad 61. This voltage is not applied to the third pad 61 at all other times.

The third shorting wiring 62 shorts the second side wirings $63_1$ to $63_n$ to connect the second side wirings $63_1$ to $63_n$ equipotentially. As shown in FIG. 7, the second side wirings $63_1$ to $63_n$ are each connected between the gate terminal of the third TFT T3 in the corresponding ESD protection device 64 and the third shorting wiring 62. The third pad 61, the second side wirings $63_1$ to $63_n$ and the third shorting wiring 62 supply the voltage Vtft-on to the ESD protection devices 64 only when the electrical inspection is carried out on the substrate. All other times, no such voltage is supplied to the third pad 61. Accordingly, since the third pad 61, the second wirings $63_1$ to $63_n$, the third shorting wiring 62 do not affect the ESD protection devices 64 during normal driving, these components remain on the substrate without being removed in the scribing process.

More specifically, on order to carry out the electrical inspection on the substrate as shown in FIGS. 6 and 7, a power supply (not shown) supplies the high voltage Vh to the first pad 44 and simultaneously supplies the low voltage Vl to the second pad 45. At the same time, the same or different power supply applies the voltage Vtft-on to the third pad 61 as discussed above. Then a TFT within each of the ESD protection devices 64 is turned on in response to the voltage Vtft-on applied via the third pad 61, the third shorting wiring 62 and the second side wirings $\mathbf{63}_1$ to $\mathbf{63}_n$, so as to form a current path between the signal wirings $\mathbf{40}_1$ to $\mathbf{40}_n$ and the first side wirings $\mathbf{48}_1$ to $\mathbf{48}_n$. In the case where each of the ESD protection devices 46 is comprised of three TFTs as shown in FIG. 3, the voltage supplied to the third pad 61 is applied to the gate terminal of the third TFT T3 maintaining a floating state upon the normal driving. In this case, the third TFT T3 is turned on in response to the voltage Vtft-on applied to its gate terminal G to form a current path between a corresponding one of the signal wirings $\mathbf{40}_1$ to $\mathbf{40}_n$ and a corresponding one of the first side wirings $\mathbf{48}_i$ to $\mathbf{48}_n$ through the third TFT T3.

If the current path is formed between the signal wirings $\mathbf{40}_1$ to $\mathbf{40}_n$ and $\mathbf{63}_1$ to $\mathbf{63}_n$ as described above, the high voltage Vh is applied and transmitted to the each of the signal wirings $\mathbf{40}_1$ to $\mathbf{40}_n$ via the first pad 44 and the first shorting wiring 47, and the low voltage Vl is applied and transmitted to the first side wirings $\mathbf{48}_1$ to $\mathbf{48}_n$ via the second pad 45 and the second shorting wiring 42, whereby the current (ion) flows from the signal wirings $\mathbf{40}_1$ to $\mathbf{40}_n$ to the first side wirings $\mathbf{48}_1$ to $\mathbf{48}_n$.

If any portion of one of the signal wirings (e.g., the third signal wiring $\mathbf{40}_3$) is opened, the current will not flow on that signal wiring. The detection of any current flow on that signal wiring will indicate whether or not there is a defect in that signal wiring.

In the current detection scheme, the current flowing on the signal wirings $\mathbf{40}_1$ to $\mathbf{40}_n$ is detected by the inspection apparatus shown in FIG. 5. Te inspector or user can determine the badness/defectiveness of any or all of the signal wirings $\mathbf{40}_1$ to $\mathbf{40}_n$ formed on the substrate in real time depending on the detected current value.

Figure 8:
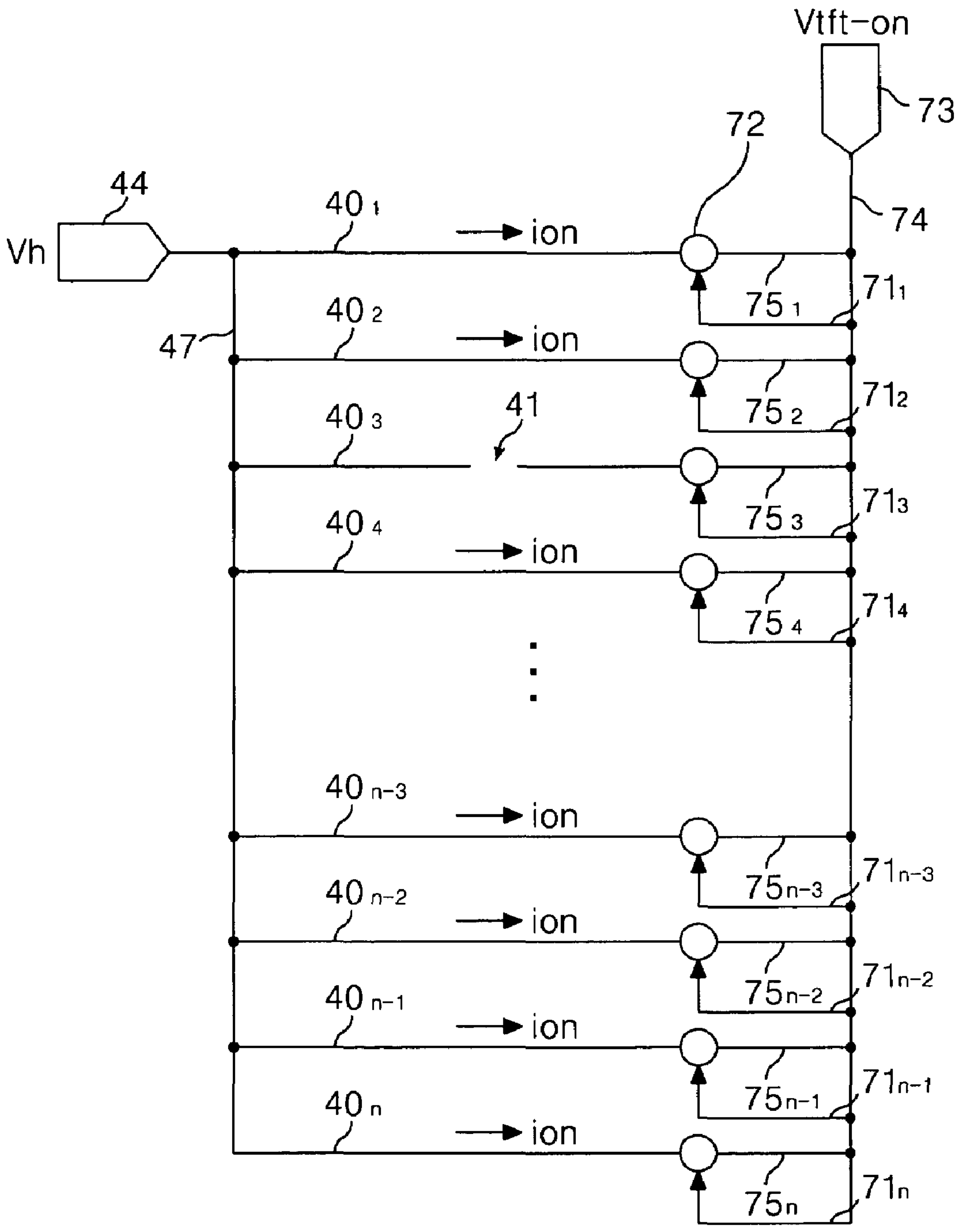
FIG. 8 illustrates an inspecting method of a liquid crystal display according to a third embodiment of the present invention.
Figure 9:
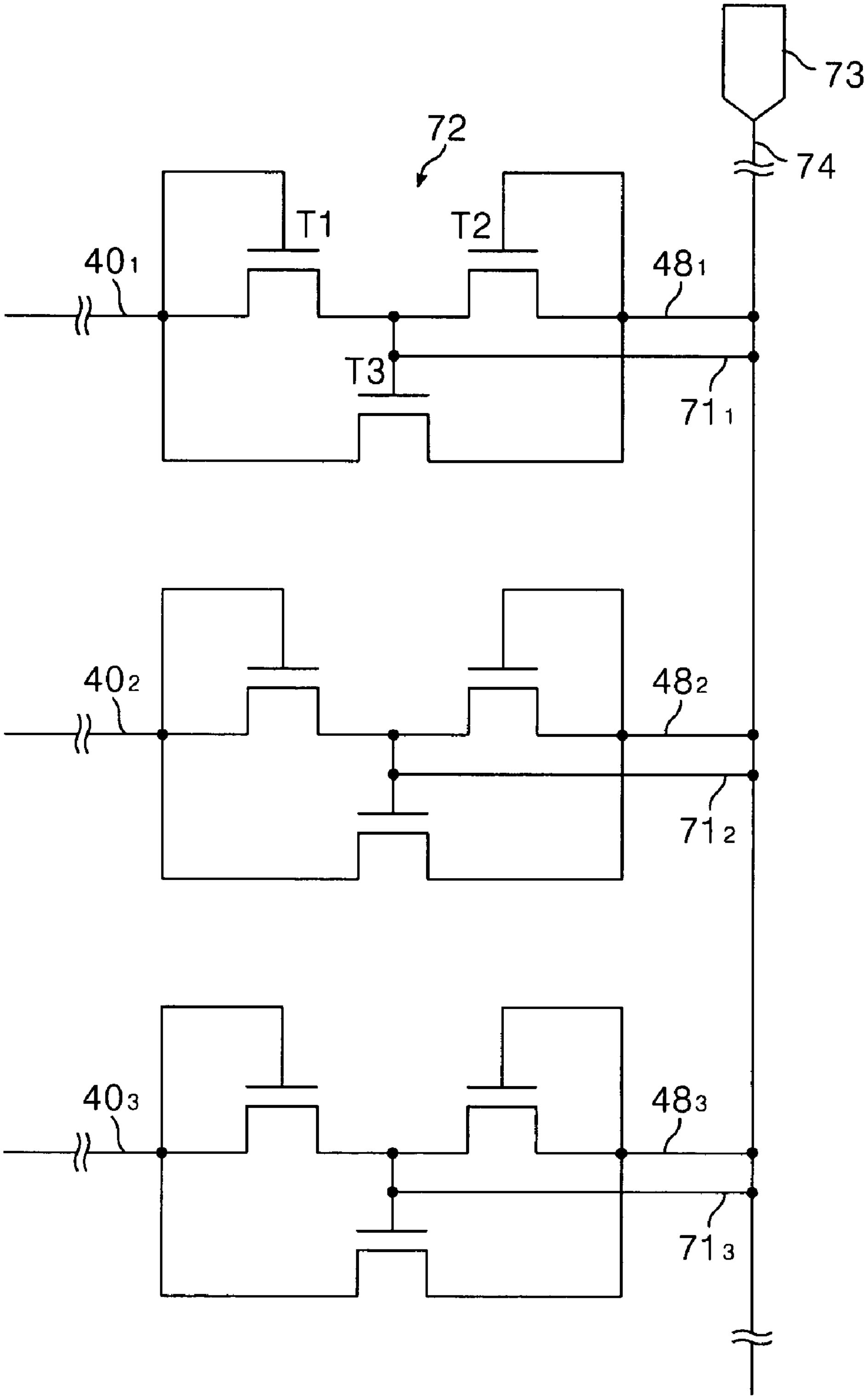
FIG. 9 is a circuit diagram in detail illustrating a connection of an ESD protection device shown in FIG. 8.

FIGS. 8 and 9 illustrate the inspection method of the liquid crystal display according to a third embodiment of the present invention. This method is implementable using the inspection apparatus shown in FIG. 5 or other suitable apparatus. In FIGS. 8 and 9, the same reference numerals are used on the same components as the substrate and the device of FIG. 4 to indicate same components, and thus the explanation therefore will be brief or omitted.

Referring to FIG. 8, the lower substrate (e.g., TFT array substrate) of the liquid crystal panel according to the third embodiment of the present invention includes a TFT array having TFTs, pixel electrodes and the signal wirings $\mathbf{40}_1$ to $\mathbf{40}_n$, and ESD protection devices 72, the first shorting wiring 47, the first pad 44, first side wirings $\mathbf{75}_1$ to $\mathbf{75}_n$, a second shorting wiring 74, a second pad 73, third side wirings $\mathbf{71}_1$ to $\mathbf{71}_n$ formed at an exterior side of the TFT array or the substrate.

When the electrical inspection on the substrate is carried out according to the third embodiment of the present invention, a voltage Vtft-on greater than the threshold voltage of a TFT (of the ESD protection device 72) for turning on forcedly the TFTs of the ESD protection devices 72 is applied at the pad 73. The second shorting wiring 74 shorts the first side wirings $\mathbf{75}_1$ to $\mathbf{75}_n$ and the third side wirings $\mathbf{75}_1$ to $\mathbf{75}_n$ to connect equipotentially all the first side wirings $\mathbf{75}_1$ to $\mathbf{75}_n$ and the third side wirings $\mathbf{71}_1$ to $\mathbf{71}n$. The third side wirings $\mathbf{71}_1$ to $\mathbf{71}_n$ are each connected between a TFT gate terminal of the ESD protection device 72 and the second shorting wiring 74. The second pad 73, the second shorting wiring 74, the first side wirings $\mathbf{75}_1$ to $\mathbf{75}_n$ and the third side wirings $\mathbf{75}_1$ to $\mathbf{75}_n$ supply the voltage Vtft-on to the ESD protection devices 72 only when the electrical inspection is carried out on the substrate. All other times, such voltage is not supplied. Accordingly, since the second pad 73, the second shorting wiring 74, the first side wirings $\mathbf{75}_1$ to $\mathbf{75}_n$ and the third side wirings $\mathbf{71}_1$ to $\mathbf{71}_n$ do not affect the ESD protection devices 72 during normal driving, these components can remain on the substrate in the scribing process.

In order to carry out the electrical inspection on the substrate according to the third embodiment, a power supply (not shown) supplies the high voltage Vh to the first pad 44 and simultaneously supplies the low voltage Vtft-on to the second pad 73. The low voltage Vtft-on is lower than the high voltage Vh, but is set up to be greater than the threshold voltage of the TFT(s) of the ESD protection devices 72 to turn on the TFT(s). The voltage Vtft-on is applied to a gate terminal of a TFT of each of the ESD protection devices 72. Then the TFTs within the ESD protection devices 72 are turned on in response to the voltage Vtft-on applied via the second pad 73, the second shorting wiring 74 and the third side wirings $\mathbf{71}_1$ to $\mathbf{71}_n$ to form a current path between the signal wirings $\mathbf{40}_1$ to $\mathbf{40}_n$ and the first side wirings $\mathbf{75}_1$ to $\mathbf{75}_n$, respectively.

If each of the ESD protection devices 72 includes three TFTs as shown in FIG. 3, the voltage Vtft-on supplied to the second pad 73 is applied to the gate terminal of the third TFT T3 (of each ESD protection device 72) maintaining the floating state upon the normal driving as shown in FIG. 9. In this case, the third TFTs T3 are turned on in response to the voltage Vtft-on applied to their gate terminal G to form the current paths between the signal wirings $\mathbf{40}_1$ to $\mathbf{40}_n$ and the first side wirings $\mathbf{75}_1$ to $\mathbf{75}_n$, correspondingly, through the third TFTs T3.

If the current path is formed between the signal wirings $\mathbf{40}_1$ to $\mathbf{40}_n$ and the first side wirings $\mathbf{75}_1$ to $\mathbf{75}_n$ as described above, the high voltage Vh is applied to the each of the signal wirings $\mathbf{40}_1$ to $\mathbf{40}_n$ via the first pad 44 and the first shorting wiring 47, and the low voltage Vtft-on is applied via the second pad 73 and the second shorting wiring 73, whereby the current (ion) flows from the signal wirings $\mathbf{40}_1$ to $\mathbf{40}_n$ to the first side wirings $\mathbf{75}_1$ to $\mathbf{75}_n$, respectively.

If any portion of one of the signal wirings (e.g., the third signal wiring $\mathbf{40}_3$) is opened, the current will not flow on that signal wiring. The detection of any current flow on that signal wiring will indicate whether or not there is a defect in that signal wiring.

In the current detection scheme, the current flowing on the signal wirings $\mathbf{40}_1$ to $\mathbf{40}_n$ is detected by the inspection apparatus shown in FIG. 5. Te inspector or user can determine the badness/defectiveness of any or all of the signal wirings $\mathbf{40}_1$ to $\mathbf{40}_n$ formed on the substrate in real time depending on the detected current value.

Each of the ESD protection devices 46, 64 and 72 can have a structure (three TFTs) as shown in FIG. 3. But the invention is not limited to such, can include other suitable structures for the ESD protection devices. Further, according to the present invention, all the signal wirings of a substrate (e.g., TFT array substrate of an LCD) to be inspected can be inspected simultaneously, sequentially, or selectively as desired by applying the appropriate voltages (Vh, Vtft-on, and/or Vl) simultaneously, sequentially, or selectively as desired. For instance, in FIG. 8, instead of providing one pad 44 for supplying the high voltage Vh, multiple pads each corresponding to one of the signal wirings can be provided to selectively or sequentially apply the high voltage Vh to the desired signal wiring(s). Other variations are possible.

As described above, when the method and apparatus for inspecting the liquid crystal display according to the present invention inspect the electrical defectiveness of the signal wirings formed on the substrate to be detected, it makes the ESD protection devices shorted or the TFTs within the ESD protection devices turned on forcedly to form the current path on the signal wiring formed in the TFT array of the effective display. By detecting the current flowing on the signal wiring, the defectiveness of any one of the signal wirings formed on the substrate can be identified and detected. Accordingly, the method and apparatus for inspecting the liquid crystal display according to the invention provide a precise and reliable inspection of the electrical components of the liquid crystal display and minimize the inspection speed greatly.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. For example, though the spirit of the invention mainly explains the electrical inspection of the liquid crystal display in the embodiment, it can be identically applied to the electrical inspection on the signal wirings formed on the flat display device different from that. Accordingly, the scope of the invention shall be determined only by the appended claims and their equivalents.

What is claimed is:

1. A method for inspecting a display device substrate having a plurality of signal wirings and a plurality of electrostatic discharge damage (ESD) protection devices, each of the ESD protection devices being respectively on a corresponding one of the signal wirings, the method comprising steps of:

using a shorting bar to individually short-circuit both ends of each of the ESD protection devices to form a current path on the corresponding one of the signal wirings;

supplying a current to the corresponding one of the signal wirings; and determining a defectiveness of the corresponding one of the signal wirings depending on the current flowing on the corresponding one of the signal wirings.

2. The method according to claim 1, wherein the short-circuiting step comprises moving the shorting bar to short-circuit the both ends of each of the ESD protection devices.

3. The method according to claim 1, wherein the step of supplying the current to the corresponding one of the signal wirings includes:

supplying a high voltage through a first shorting wiring connected to the corresponding one of the signal wirings; and supplying a low voltage through a second shorting wiring connected to the at least one of the ESD protection devices.

4. The method according to claim 1, wherein in the short-circuiting step, the display device substrate is a TFT array substrate of a liquid crystal display.

5. An apparatus for inspecting a display device substrate having a plurality of signal wirings and a plurality of electrostatic discharge damage (ESD) protection devices, each of the ESD protection devices being respectively on a corresponding one of the signal wirings, the apparatus comprising:

a conductive shorting bar to individually short-circuit both ends of each of the ESD protection devices to form a current path on the corresponding one of the signal wirings;

a power supply to supply a current to the corresponding one of the signal wirings; and a detection circuit to determine a defectiveness of the corresponding one of the signal wirings depending on the current flowing on the corresponding one of the signal wirings.

6. The apparatus according to claim 5, wherein the conductive shorting bar is provided in a jig and is movable.

7. The apparatus according to claim 5, further comprising:

a first shorting wiring connected to the corresponding one of the signal wirings; and a second shorting wiring connected to the at least one of the ESD protection devices, wherein the power supply supplies a high voltage to the corresponding one of the signal wirings through the first shorting wiring, and a low voltage to the at least one of the ESD protection devices through the second shorting wiring.

8. The apparatus according to claim 5, wherein the display device substrate is a TFT array substrate of a liquid crystal display.

9. An apparatus for inspecting a display device substrate having a plurality of signal wirings and a plurality of electrostatic discharge damage (ESD) protection devices connected to the signal wiring, each of the ESD protection devices being respectively on a corresponding one of the signal wirings, the apparatus comprising:

a movable conductive shorting bar, the conductive shorting bar being movable to selectively short-circuit both ends of at least one of the ESD protection devices to form a current path on the corresponding one of the signal wirings;

a power supply to supply a current to the corresponding one of the signal wirings; and a detection circuit to determine a defectiveness of the corresponding one of the signal wirings depending on the current flowing on the corresponding one of the signal wirings.

* * * * *